United States Patent [19]
Baliga et al.

[11] Patent Number: 5,679,966
[45] Date of Patent: Oct. 21, 1997

[54] DEPLETED BASE TRANSISTOR WITH HIGH FORWARD VOLTAGE BLOCKING CAPABILITY

[75] Inventors: Bantval Jayant Baliga; Naresh I. Thapar, both of Raleigh, N.C.

[73] Assignee: North Carolina State University, Raleigh, N.C.

[21] Appl. No.: 539,748

[22] Filed: Oct. 5, 1995

[51] Int. Cl.$^6$ .................... H01L 29/74; H01L 31/111; H01L 31/0312

[52] U.S. Cl. .................... 257/139; 257/144; 257/77

[58] Field of Search .................... 257/139, 144, 257/330, 331, 332, 341, 342, 77

[56] References Cited

U.S. PATENT DOCUMENTS

| | | | |
|---|---|---|---|
| 3,412,297 | 11/1968 | Amlinger | 317/235 |
| 4,288,801 | 9/1981 | Ronen | 357/41 |
| 4,791,462 | 12/1988 | Blanchard et al. | 357/23.4 |
| 4,903,189 | 2/1990 | Ngo et al. | 363/127 |
| 4,914,058 | 4/1990 | Blanchard | 437/203 |
| 4,982,260 | 1/1991 | Chang et al. | 357/38 |
| 5,233,215 | 8/1993 | Baliga | 257/490 |
| 5,298,781 | 3/1994 | Cogan et al. | 257/333 |
| 5,355,003 | 10/1994 | Tomomatsu | 257/139 |
| 5,396,085 | 3/1995 | Baliga | 257/77 |
| 5,473,176 | 12/1995 | Kakumoto | 257/192 |
| 5,558,313 | 9/1996 | Hshieh et al. | 257/342 |

FOREIGN PATENT DOCUMENTS

| | | |
|---|---|---|
| 0 380 340 A2 | 8/1990 | European Pat. Off. . |
| 0 506 450 A2 | 9/1992 | European Pat. Off. . |
| 62-198160 | 9/1987 | Japan . |
| 2239561 | 7/1991 | United Kingdom . |

OTHER PUBLICATIONS

B. Jayant Baliga, *"Power MOSFET"*, Chapter 7, Power Semiconductor Devices, 1996, pp. 335–425 no month.

B. Jayant Baliga, *"Insulated Gate Bipolar Transistor"*, Chapter 8, Power Semiconductor Devices, 1996, pp. 426–502 no month.

Matsumoto et al., *"A High–Performance Self –Aligned UMOSFET With a Vertical Trench Contact Structure"*, IEEE Transactions on Electron Devices, vol. 41, No. 5, May 1994, pp. 814–818.

*Primary Examiner*—Wael Fahmy
*Attorney, Agent, or Firm*—Myers Bigel Sibley & Sajovec, L.L.P.

[57] ABSTRACT

A depleted base transistor with high forward voltage blocking capability includes cathode and anode regions on opposite faces of a semiconductor substrate, a base region therebetween, a rectifying junction for depleting a portion of the base region of majority free carriers and an insulated gate electrode in a trench for modulating the conductivity of the depleted portion of the base region. The regions are formed as a vertical stack of semiconductor layers with the anode region (e.g., P+) as the bottom layer, the buffer region (e.g., N+) on the anode region, the drift region/e.g., N–) on the buffer region, the blocking voltage enhancement region (e.g., N–) on the drift region and the cathode region (e.g., N+) as the top layer on the blocking voltage enhancement region. The trench extends into the substrate at the first face so that a sidewall thereof extends adjacent the cathode region and the blocking voltage enhancement region and defines an interface between these adjacent regions and the interior of the trench which contains the insulated gate electrode. The rectifying junction is provided to deplete at least a portion of the blocking voltage enhancement region so that the P-N diode formed by the stack of anode, buffer, drift, blocking voltage enhancement and cathode regions blocks forward voltages when the insulated gate electrode is maintained at the same potential as the cathode region.

34 Claims, 12 Drawing Sheets

DEPLETED BASE TRANSISTOR WITH HIGH FORWARD VOLTAGE BLOCKING CAPABILITY

FIELD OF THE INVENTION

The present invention relates to semiconductor switching devices, and more particularly to transistors for high power applications.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type channel region in response to the application of a positive gate bias. The inversion layer electrically connects the N-type source and drain regions and allows for majority carrier conduction therebetween.

The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carrier transport only, the delay associated with the recombination of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop of power MOSFETs increases with increasing temperature, thereby promoting an even current distribution in parallel connected devices.

In view of these desirable characteristics, many variations of power MOSFETs have been designed. Two popular types are the double-diffused MOS (DMOS) device and the ultralow on-resistance MOS device (UMOS). These and other power MOSFETs are described in a textbook by coinventor Baliga entitled *Power Semiconductor Devices*, PWS Publishing Co. (ISBN 0-534-94098-6), the disclosure of which is hereby incorporated herein by reference. Chapter 7 of this textbook describes power MOSFETs at pages 335–425. Another example of a silicon power MOSFET is shown in FIG. 1. FIG. 1 is a reproduction of FIG. 4 from U.S. Pat. No. 4,903,189 to Ngo et al. and coinventor Baliga, the disclosure of which is hereby incorporated herein by reference. This MOSFET 170, which contains no P-N junction in the current path, is commonly referred to as an accumulation-mode FET ("ACCU-FET") because turn-on is achieved by forming a conductive accumulation layer between the FET's source 186 and drain 182 regions. FIG. 1 shows a plurality of parallel connected ACCU-FET cells, each defined by mesas 179 and opposing trenches 178. Other examples of MOS-gated power transistors for high power applications are shown in Great Britain patent application No. GB 2,239,561 A. In particular, FIG. 2, which is a reproduction of FIG. 3(E) from the Great Britain application, illustrates an insulated gate electrostatic induction type transistor where high power conduction is also accomplished by formation of an accumulation layer.

The above-described beneficial characteristics of power MOSFETs are typically offset, however, by the relatively high on-resistance of the MOSFET's channel region, which arises from the absence of minority carrier injection. As a result, a MOSFET's operating forward current density is typically limited to relatively low values, typically in the range of 10 A/cm$^2$, for a 600 V device, as compared to 40–50 A/cm$^2$ for the bipolar transistor. On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. One example of a hybrid device is the Insulated Gate Bipolar Transistor (IGBT) described in Chapter 8 of the aforementioned Baliga textbook.

The IGBT combines the high impedance gate of the power MOSFET with the small on-state conduction losses of the power bipolar transistor. An added feature of the IGBT is its ability to block both forward and reverse bias voltages. Because of these features, the IGBT has been used extensively in inductive switching circuits, such as those required for motor control applications. These applications require devices having wide forward-biased safe-operating-area (FBSOA) and wide reverse-biased safe-operating-area (RBSOA). One embodiment of an IGBT is disclosed in an article by coinventor B. J. Baliga and M. S. Adler, R. P. Love, P. V. Gray and N. Zommer, entitled *The Insulated Gate Transistor: A New Three terminal MOS Controlled Bipolar Power Device*, IEEE Trans. Electron Devices, ED-31, pp. 821–828 (1984), the disclosure of which is hereby incorporated herein by reference. Based on experimental results, on-state losses were shown to be greatly reduced when compared to power MOSFETs. This was caused by the conductivity modulation of the IGBT's drift region during the on-state. Moreover, very high conduction current densities in the range of 200–300 A/cm² were also achieved. Accordingly, an IGBT can be expected to have a conduction current density approximately 20 times that of a power MOSFET and five (5) times that of an equivalent bipolar transistor. Typical turn-off times for the IGBT can be in the range of 10–50 µs.

The basic structure of the IGBT is shown in cross-section in FIG. 3A, which is a reproduction of FIG. 1 from the aforementioned Baliga et al. article. In the IGBT, forward conduction can occur by positively biasing the anode (or electron "collector") with respect to the cathode (or electron "emitter") and applying a positive gate bias of sufficient magnitude to invert the surface of the P-base region under the gate. By creating an inversion layer in the P-base region, electrons are allowed to flow from the N+ emitter region to the N-base region. In this forward conducting state, the junction J2 is forward biased and the P+ anode region injects holes into the N-Base region. As the anode bias is increased, the injected hole concentration increases until it exceeds the background doping level of the N-base. In this regime of operation, the device operates like a forward-biased P-i-N diode with heavy conductivity modulation of the N-base region. In the reverse bias region, the anode is biased negative with respect to the cathode and the lower junction (J3) is reversed biased, thereby preventing conduction from the cathode to anode even though the upper junction (J2) is forward biased. This provides the device with its reverse blocking capability.

The IGBT can typically operate at high current densities even when designed for operation at high blocking voltages. As long as the gate bias is sufficiently large to produce enough inversion layer charge for providing electrons into the N-base region, the IGBT forward conduction characteristics will look like those of a P-i-N diode. However, if the inversion layer conductivity is low, a significant voltage drop will begin to appear across this region like that observed in conventional MOSFETs. At this point, the forward current will saturate and the device will operate in its active or current saturation region, as shown in FIG. 3B, which is a reproduction of FIG. 2 from the aforementioned Baliga et al. article. As will be understood by those skilled in the art, high voltage current saturation is ultimately limited by avalanche induced breakdown. Finally, because the elimination of the inversion layer cuts off the supply of electrons into the N-base region and because there is no self-sustaining source of electrons to the N-base region, the IGBT will typically turn off even if the anode remains positively biased.

One significant drawback to the operation of IGBTs is the presence of a parasitic P-N-P-N structure between the anode and cathode which can cause a loss in the gate controlled turn-off capability by becoming regenerative at high current densities. The current level at which parasitic thyristor latch-up occurs provides a limit to FBSOA at low anode voltages, while at high anode voltages, FBSOA is limited by dynamic avalanche breakdown.

As will be understood by one skilled in the art, latch-up can be prevented so long as the sum of the current gains of the regeneratively coupled P-N-P and N-P-N transistors ($\alpha_{pnp}$, $\alpha_{npn}$) is less than unity. To inhibit the likelihood of latch-up operation, the current gain of the N-P-N transistor ($\alpha_{npn}$) can be made relatively small by reducing the P-base sheet resistance and/or the width of the N⁺ source region. This suppresses electron injection from the N⁺ source region to the P-base because the uppermost P-N junction between the P-base and N⁺ source is effectively short circuited, thereby eliminating the regenerative P-N-P-N path from between the anode and cathode.

Attempts have been made to reduce the IGBT's susceptibility to latch-up. For example, in an article by A. M. Goodman, J. P. Russell, L. A. Goodman, C. J. Nuese and J. M. Neilson, entitled *Improved COMFETs with Fast Switching Speed and High-Current Capability*, IEEE International Electron Devices Meeting Digest, Abstract 4.3, (1983), pp. 79–82, a highly doped (N⁺) epitaxial layer was formed on top of the P+ anode region at junction J3 in order to lower the gain of the lower P-N-P transistor ($\alpha_{pnp}$) and thereby reduce the likelihood of parasitic latch-up at high current densities. An attempt to reduce an IGBT's susceptibility to latch-up is also disclosed in U.S. Pat. No. 5,396,087 entitled Insulated Gate Bipolar Transistor With Reduced Susceptibility to Parasitic Latch-Up, the disclosure of which is hereby incorporated herein by reference. In this IGBT, injection suppressing means is provided between the N+ emitter and P-base region to prevent minority carrier injection from the N+ emitter to the P-base when the anode is biased positive relative to the cathode. Injection suppressing means preferably includes an electrical insulator such as $SiO_2$.

Another attempt to reduce an IGBT's susceptibility to latch-up is disclosed in a copending patent application Ser. No. 08/249,449, filed May 26, 1994, entitled Latch-Up Resistant Bipolar Transistor with Trench IGFET and Buried Collector, the disclosure of which is hereby incorporated herein by reference. In this IGBT, a dual-channel insulated gate field effect transistor is provided adjacent a sidewall of a trench so that gated turn-on and turn-off control can be achieved. In addition, a buried collector region is provided adjacent a bottom of the trench in order to inhibit sustained parasitic latch-up during turn-off. However, this IGBT does not have very high turn-off/surge current handling capability.

Notwithstanding these attempts to develop improved IGBTs for high power applications, there still continues to be a need to develop additional semiconductor switching devices which have low on-state resistance, high forward voltage blocking capability, high voltage current saturation capability and high maximum controllable current density. There also continues to be a need for switching devices which have wide forward-biased safe-operating-area (FBSOA), reduced susceptibility to regenerative parasitic latch-up and high turn-off/surge current capability.

SUMMARY OF THE INVENTION

It is therefore an object of the present invention to provide a semiconductor switching device which is capable of handling high forward current densities with low on-state voltage drop and has low gate drive power requirements.

It is a further object of the present invention to provide a semiconductor switching device which has reduced susceptibility to parasitic latch-up and has high forward voltage blocking capability.

It is another object of the present invention to provide a semiconductor switching device which has high voltage current saturation capability and has a high maximum controllable current density.

It is still another object of the present invention to provide a semiconductor switching device which has a wide forward-biased safe-operating-area (FBSOA) and has high surge current capability.

These and other objects are provided, according to the present invention, by a depleted base transistor (DBT) which comprises cathode and anode regions on opposite faces of a semiconductor substrate, a base region therebetween, means for depleting a portion of the base region of majority free carriers and an insulated gate electrode in a trench for modulating the conductivity of the depleted portion of the base region. According to a preferred embodiment of the present invention, the base region comprises a plurality of first conductivity type regions having different doping concentrations so that the transistor simultaneously has high forward voltage blocking capability and low on-state voltage drop.

Most preferably, the base region comprises a buffer region, a drift region and a blocking voltage enhancement region which has an average doping concentration at a level less than about one half times the average doping concentration in the drift region. In this embodiment, the transistor includes a vertical stack of semiconductor layers formed by the anode region (e.g., P+) as the bottom layer, the buffer region (e.g., N+) on the anode region, the drift region (e.g., N−) on the buffer region, the blocking voltage enhancement region (e.g., N−) on the drift region and the cathode region (e.g., N+) as the top layer on the blocking voltage enhancement region. These regions are preferably doped to form abrupt junctions with adjacent regions. The trench also extends into the substrate at the first face so that a sidewall thereof extends adjacent the cathode region and the blocking voltage enhancement region and defines an interface between these adjacent regions and the interior of the trench which contains the insulated gate electrode. The trench can also have a bottom which defines an interface between the insulated gate electrode and the drift region. Preferred characteristics can also be achieved for a transistor having an N-type base region, by using a P-type polysilicon insulated gate electrode.

A rectifying junction is provided in the substrate for depleting at least a portion of the blocking voltage enhancement region so that the P-N diode formed by the stack of anode, buffer, drift, blocking voltage enhancement and cathode regions blocks forward voltages when the insulated gate electrode is maintained at the same potential as the cathode region. To substantially deplete the blocking voltage enhancement region of majority free carriers and thereby improve the forward voltage blocking capability, the rectifying junction comprises a P-N or Schottky rectifying junction which is formed in the substrate and spaced from and opposite the trench sidewall. Preferably, the geometry of the transistor, the spacing of the rectifying junction from the trench sidewall and the built-in potential of the P-N junction (or the work function of the Schottky metal) are selected to fully deplete the blocking voltage enhancement region of majority free carriers and thereby electrically isolate the cathode region from the drift region until an appropriate gate bias of sufficient magnitude is applied to the insulated gate electrode. The use of a Schottky rectifying junction also eliminates any possibility of latch-up induced failure caused by a parasitic thyristor since no P-N-P-N path exists between the anode region and cathode region.

For a transistor having an N-type drift region, the application of a sufficiently positive gate bias causes the formation of a highly conductive N-type accumulation layer channel in the depleted blocking voltage enhancement region, between the cathode region and the drift region. Thus, the application of an appropriate gate bias provides a path for majority carriers to flow from the cathode region into the drift region and to the anode region when the transistor is forward biased. This provides the transistor with I-V characteristics that are similar to a P-i-N diode with a trench IGFET in series for regulating the current flow. This results in low on-state voltage drop even for low carrier lifetimes in the drift region. Furthermore, by doping the blocking voltage enhancement region at a level less than one half times the doping concentration of the drift region, substantially improved forward voltage blocking characteristics can be achieved with no degradation in forward voltage drop relative to a transistor having drift and blocking voltage enhancement regions which are doped to the same levels.

The above described bipolar depleted base transistor having a P-N junction formed between the anode and base region is preferably formed in a monocrystalline silicon substrate, or more preferably, a monocrystalline silicon carbide substrate. The depleted base transistor of the present invention can also include a device having no forward biased P-N junctions in the forward conduction path by eliminating the anode region of second conductivity type so that the anode contact ohmically contacts the buffer region.

According to still another embodiment of the present invention, the blocking voltage enhancement region can be eliminated in favor of a larger drift region having a nonuniform doping concentration which approximates the improved performance achieved by the blocking voltage enhancement region. In particular, the drift region can be doped to provide a doping profile which has a negative slope in a direction from the anode region to the cathode region or at least a monotonically decreasing slope in a direction from the anode region to the cathode region. Thus, even without the lower doped blocking voltage enhancement region, the drift region can be doped so that its upper portion, which extends opposite the trench sidewall, has a lower doping concentration and can be fully depleted by the P-N or Schottky rectifying junction which is spaced from the trench sidewall. In this embodiment, the monotonically decreasing doping profile is preferably selected so that the doping concentration in the drift region at the trench bottom is less than about one half times the maximum doping concentration of the drift region adjacent the buffer region.

A depleted base transistor of the present invention exhibits high voltage current saturation capability because the forward biased anode potential opposes low gate biases and causes pinch-off of the accumulation layer formed across the blocking voltage enhancement region. The occurrence of parasitic thyristor latch-up can also be almost entirely suppressed or eliminated so the depleted base transistor of the present invention has high maximum controllable current density. The transistor also has excellent surge current handling capability because of its diode like on-state characteristics.

DESCRIPTION OF PREFERRED EMBODIMENTS

Figure 1:
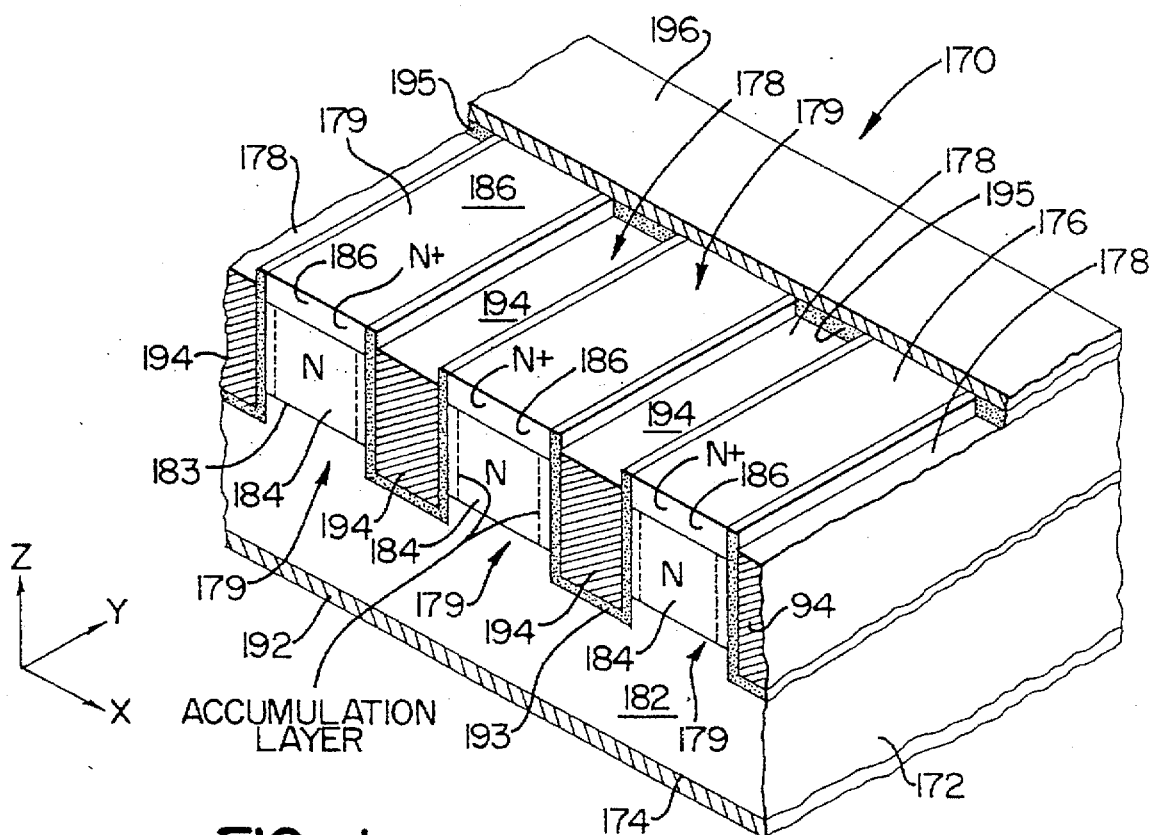
FIG. 1 is a cross-sectional illustration of a prior art silicon ACCUFET.
Figure 2:
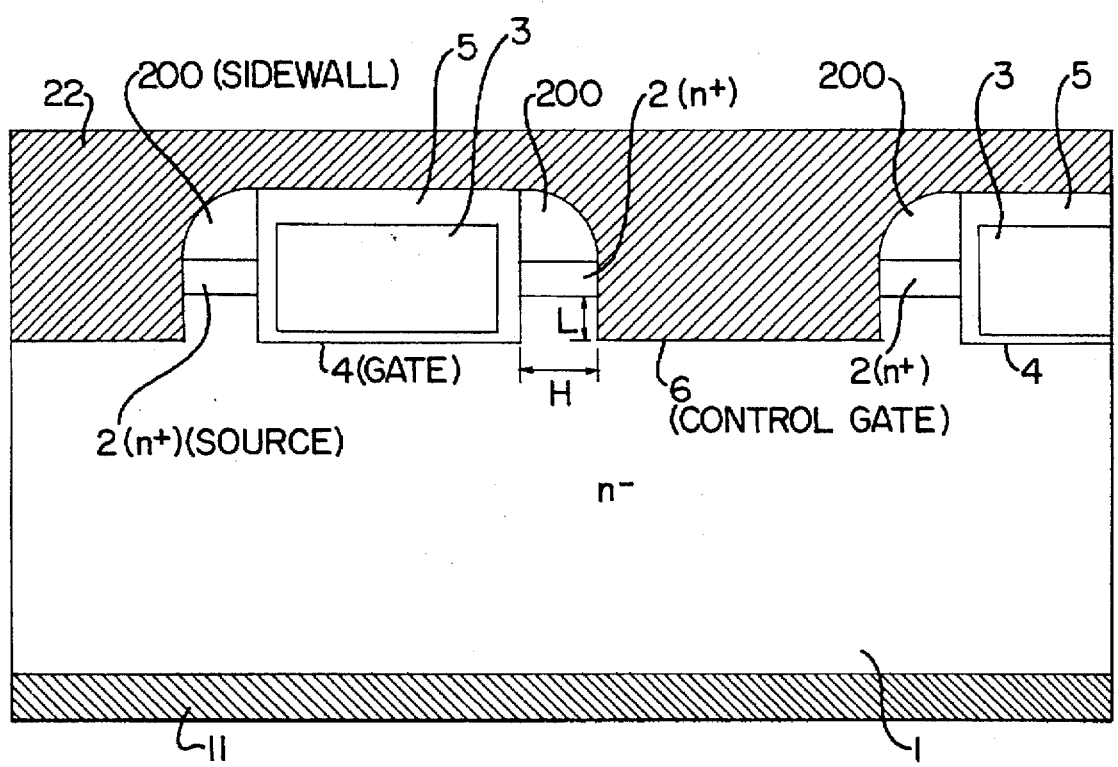
FIG. 2 is a cross-sectional illustration of a prior art insulated gate electrostatic induction type transistor.
Figure 3A:
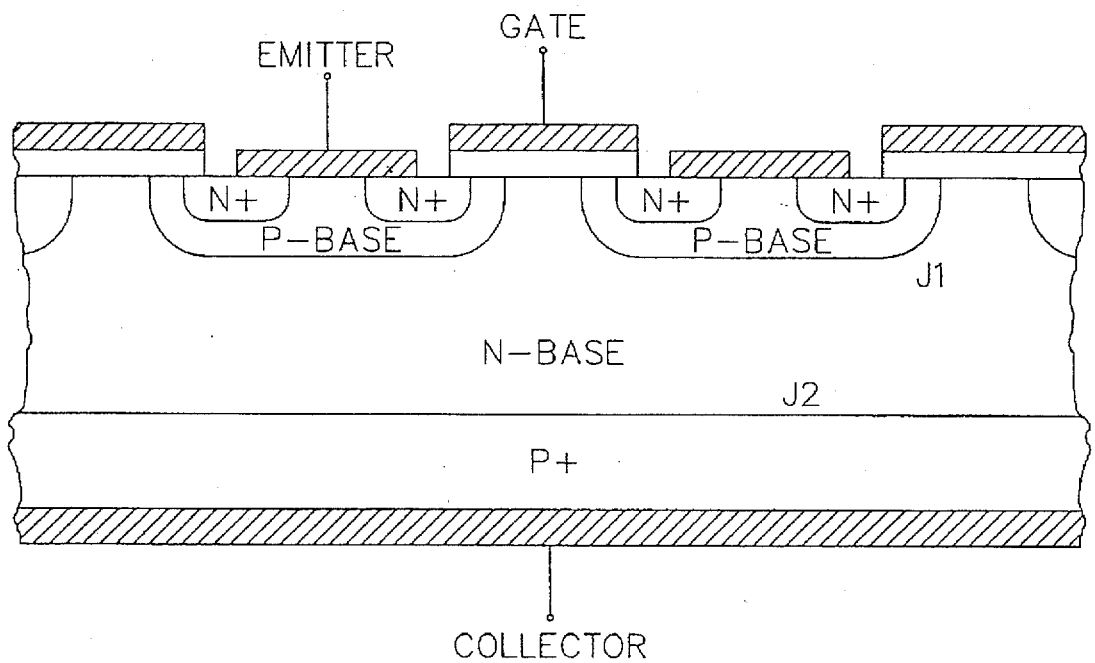
FIG. 3A is a cross-sectional illustration of a prior art IGBT.
Figure 3B:
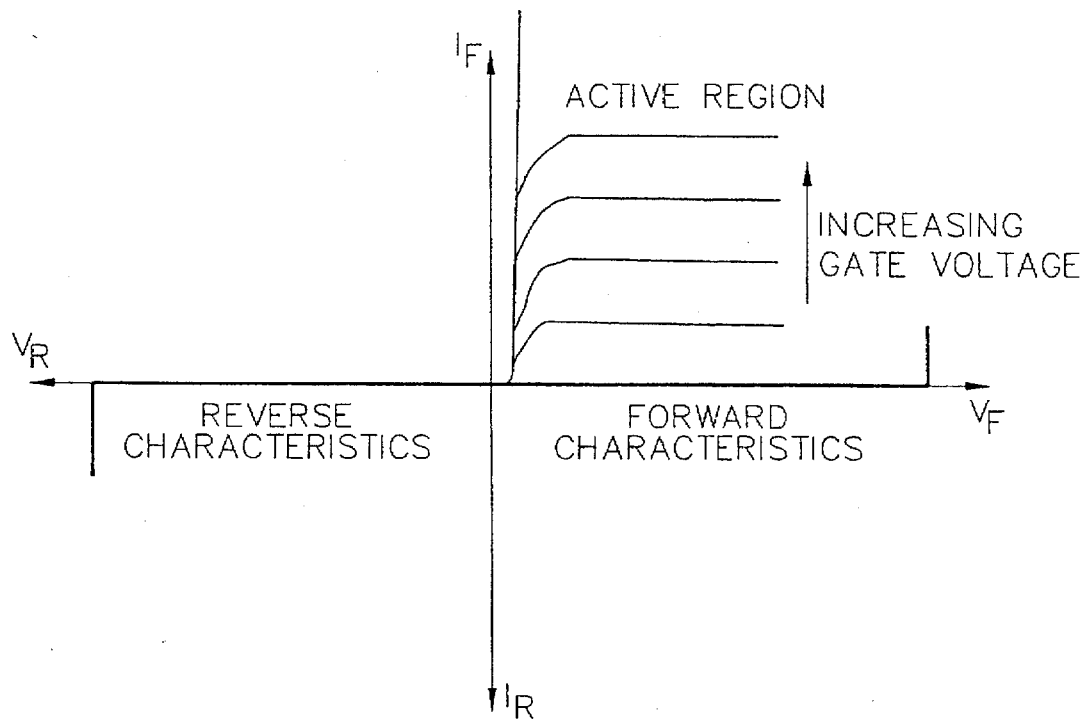
FIG. 3B is a simulated graph of current versus voltage for the IGBT of FIG. 3A, at various gate voltages.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type, however, each embodiment described and illustrated herein includes its complementary embodiment as well.

Figure 4:
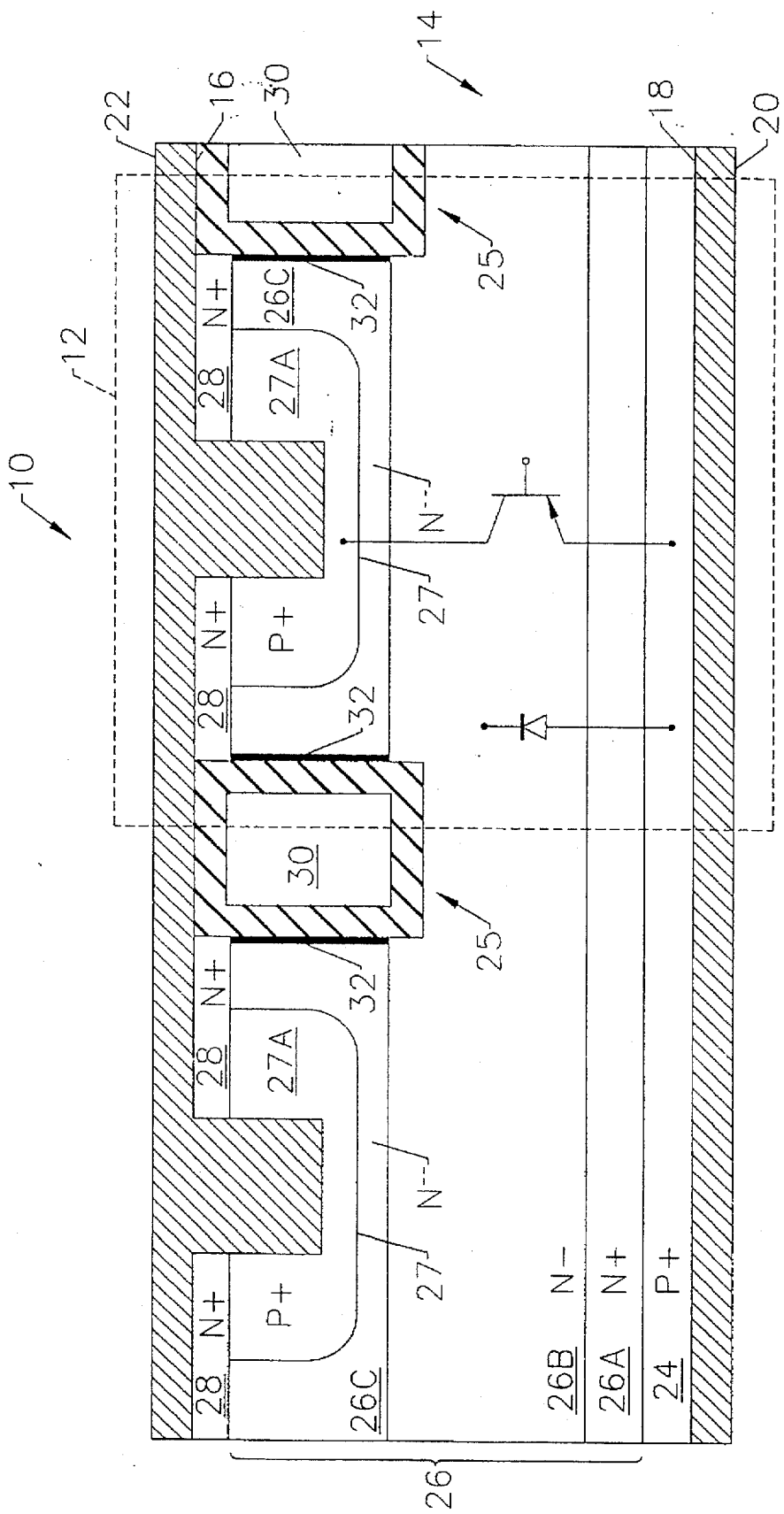
FIG. 4 is a cross-section illustration of a bipolar depleted base transistor according to a first embodiment of the present invention.
Figure 5:
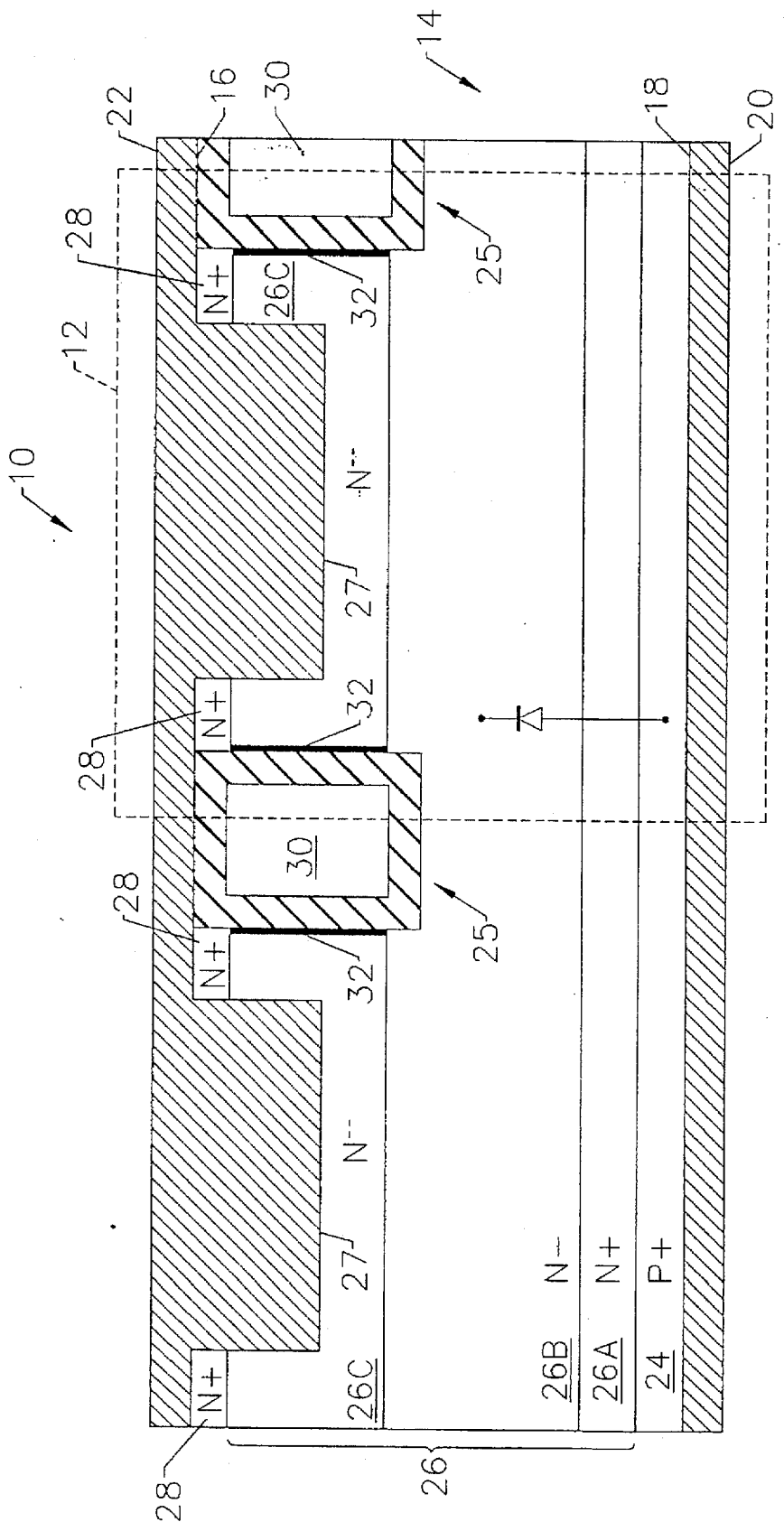
FIG. 5 is a cross-section illustration of a bipolar depleted base transistor according to a second embodiment of the present invention.
Figure 6:
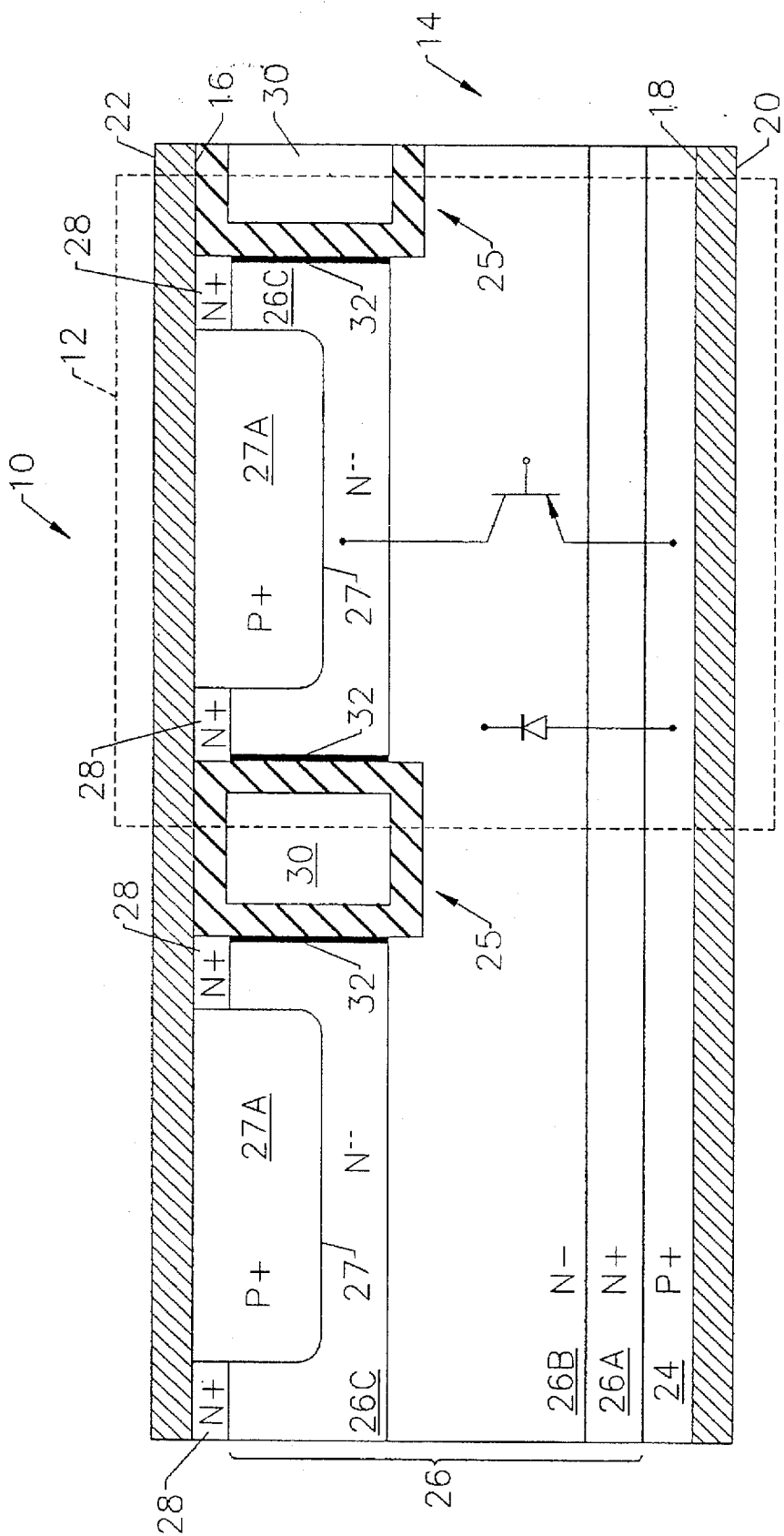
FIG. 6 is a cross-section illustration of a bipolar depleted base transistor according to a third embodiment of the present invention.

Referring now to FIGS. 4–6, three embodiments of a switching device 10 comprising a plurality of depleted base transistor (DBT) cells 12 according to the present invention are illustrated. The switching device 10 is preferably formed in a semiconductor substrate 14 of monocrystalline silicon, or more preferably, monocrystalline silicon carbide. The depleted base transistor cells 12 are preferably parallel-connected to each other in the substrate 14, between first and second opposing faces 16 and 18, respectively. By connecting the cells 12 in parallel, the switching device 10 can be utilized for high current applications. The switching device 10 has three terminals for providing gated turn-on and turn-off control. These terminals include an anode contact 20, a cathode contact 22 and an insulated gate electrode 30. The switching device 10 also includes an anode region 24 of second conductivity type (shown as P-type) in the substrate 14 at the second face 18 and a cathode region 28 of first conductivity type (shown as N-type) in the substrate at the first face 16. The anode and cathode regions 24 and 28 form respective ohmic contacts with the anode and cathode contacts 20 and 22. A base region 26 of first conductivity type (shown as N-type) is also provided in the substrate 14, between the cathode region 28 and the anode region 24. The base region 26 preferably forms abrupt non-rectifying and P-N rectifying junctions with the cathode region 28 and the anode region 24, respectively.

According to a preferred embodiment of the present invention, the base region 26 comprises a plurality of first conductivity type regions having different doping concentrations so that the device 10 can simultaneously achieve, among other things, high forward voltage blocking capability and low on-state voltage drop. In particular, the base region 26 comprises a buffer region 26A, a drift region 26B and a blocking voltage enhancement region 26C. The blocking voltage enhancement region 26C preferably has an average doping concentration at a level less than the average doping concentration in the drift region 26B, and preferably less than about one half times the doping concentration in the drift region. Additional improvements in the forward blocking voltage characteristics can also be achieved by doping the blocking voltage enhancement region 26C at a level less than about one tenth the average doping concentration in the drift region 26B without degradation in the forward voltage drop. As illustrated, the switching device 10 includes a vertical stack of semiconductor layers formed by the anode region 24 (e.g., P+) as the bottom layer, the buffer region 26A (e.g., N+) on the anode region 24, the drift region 26B (e.g., N−) on the buffer region 26A, the blocking voltage enhancement region 26C (e.g., N−) on the drift region 26B and the cathode region 28 (e.g., N+) as the top layer on the blocking voltage enhancement region 26C. These regions are preferably doped to form a series of abrupt semiconductor junctions (e.g., $P^+N^+N^-N^-N^+$) with adjacent regions. Accordingly, the doping profile in the base region 26 can be "stepped" in a monotonically decreasing manner in a direction from the anode region 24 to the cathode region 28. As illustrated, the abrupt semiconductor junctions can be rectifying (e.g., P-N junction) or non-rectifying (e.g., $N^+$-$N^-$). For example, the buffer, drift and blocking voltage enhancement regions 26A–C may be doped with an N-type dopant to levels of $5\times10^{16}$ cm$^3$, $1\times10^{14}$ cm$^{-3}$ and $1\times10^{13}$ cm$^{-3}$, respectively, for a silicon device.

To provide gated turn-on and turn-off control, an insulated gate electrode 30 is provided in a plurality of adjacent U-shaped or V-shaped trenches 25 (i.e., grooves). The insulated gate electrode 30 may include a metal, however, for an N-type base region 26 the insulated gate electrode 30 is preferably P-type polycrystalline silicon. The use of P-type polycrystalline silicon provides an appropriate work function difference between the gate electrode 30 and the blocking voltage enhancement region 26C and ensures that no accumulation layer channel will be present in the blocking voltage enhancement region 26C when the gate electrode 30 is at zero potential bias relative to the cathode region 28. The trenches 25 are preferably of stripe or similar geometry and extend parallel to each other in a third dimension, not shown. The trenches 25 are formed in the substrate 14 at the first face 16 so that sidewalls thereof extend adjacent the cathode region 28 and the blocking voltage enhancement region 26C and also define interfaces between these adjacent regions and the interior of the trenches 25 which contain the insulated gate electrode 30. As illustrated, each trench 25 can also have a bottom which defines an interface between the insulated gate electrode 30 and the drift region 26B. To help maintain a low on-state voltage drop across the device 10, the lowermost portions of the sidewalls of the trenches 25 also preferably define interfaces between the insulated gate electrode 30 and the drift region 26B. Thus, the blocking voltage enhancement region 26C preferably does not extend below the bottom of the trenches 25.

Means is also provided in the substrate for depleting a portion of the base region of majority free carriers to inhibit the traversal of majority carriers across the drift region 26B, from the cathode region 28 towards the anode region 24. In particular, depleting means includes a rectifying junction 27 for depleting at least a portion of the blocking voltage enhancement region 26C so that the P-N diode formed by the stack of anode, buffer, drift, blocking voltage enhancement and cathode regions blocks forward voltages when the insulated gate electrode 30 is maintained at the same potential as the cathode region 28. To substantially deplete the blocking voltage enhancement region 26C of majority free carriers and thereby improve the forward voltage blocking capability, the rectifying junction 27 may comprise a P-N junction (having a collector region 27A of second conductivity type) or a Schottky junction. The rectifying junction 27 is preferably formed in the substrate 14 so that a portion of the junction 27 is spaced from and opposite the trench sidewall. Preferably, the geometry of the transistor cells 12, the spacing of the rectifying junction 27 from the trench sidewall and the built-in potential of the P-N junction formed by regions 27A and 26C (or the work function of the Schottky metal) are selected to fully deplete the blocking voltage enhancement region of majority free carriers when the junction 27 is under reverse bias. This electrically isolates the cathode region 28 from the drift region 26B until an appropriate gate bias of sufficient magnitude is applied to the insulated gate electrode 30.

As will be understood by those skilled in the art, the device 10 can be made to block high forward voltages by selecting, among other things, the spacing between the rectifying junction 27 and the trench sidewalls so that the built-in potential of the rectifying junction formed by the collector region 27A (or the Schottky metal) and blocking voltage enhancement region 26C causes a complete depletion of free majority carriers from the blocking voltage enhancement region 26C, even when zero potential bias is applied to the gate electrodes 30. The conductivity and doping of the gate electrode 30 can also be chosen so that complete depletion of free majority carriers occurs. The high doping of the collector region 27A and the ohmic contact between the collector region 27A and the cathode contact 22, as illustrated by the embodiments of FIGS. 4 and 6, also render the P-N-P-N thyristor formed by regions 24, 26, 27A and 28 inactive even for high forward current densities. Referring now to FIG. 5, the use of a Schottky rectifying junction, formed by the cathode contact metal and the blocking voltage enhancement region 26C, also eliminates any possibility of latch-up induced failure caused by a parasitic thyristor since no regenerative P-N-P-N path exists between the anode region 27A and cathode region 28.

The application of a sufficiently positive gate bias to a device 10 having an N-type base region 26 causes the formation of a highly conductive N-type accumulation layer channel 32 in the depleted blocking voltage enhancement region 26C. This channel 32 extends along the interface between the insulated gate electrode 30 and the blocking voltage enhancement region 26C and in series between the cathode region 28 and the drift region 26B. Thus, the application of an appropriate gate bias to the insulated gate electrode 24 provides a path for majority carriers (e.g., electrons) to flow from the cathode region 28 into the drift region 26B and to the anode region 24 when the device 10 is forward biased. This provides the device 10 with I-V characteristics that are similar to a P-i-N diode with a trench IGFET in series for regulating the current flow. The accumulation layer channel 32 also provides the base drive current for the vertical P⁺N⁺N⁻N⁻P⁺ bipolar transistor formed by regions 24, 26 and 27A, as illustrated schematically in FIGS. 4 and 6. This results in low on-state voltage drop even for low carrier lifetimes in the drift region 26B. Furthermore, by doping the blocking voltage enhancement region 26C at a level less than one half times the doping concentration of the drift region 26B, substantially improved forward voltage blocking characteristics can be achieved with no degradation in forward voltage drop relative to a transistor having drift and blocking voltage enhancement regions which are doped to the same levels.

Figure 7:
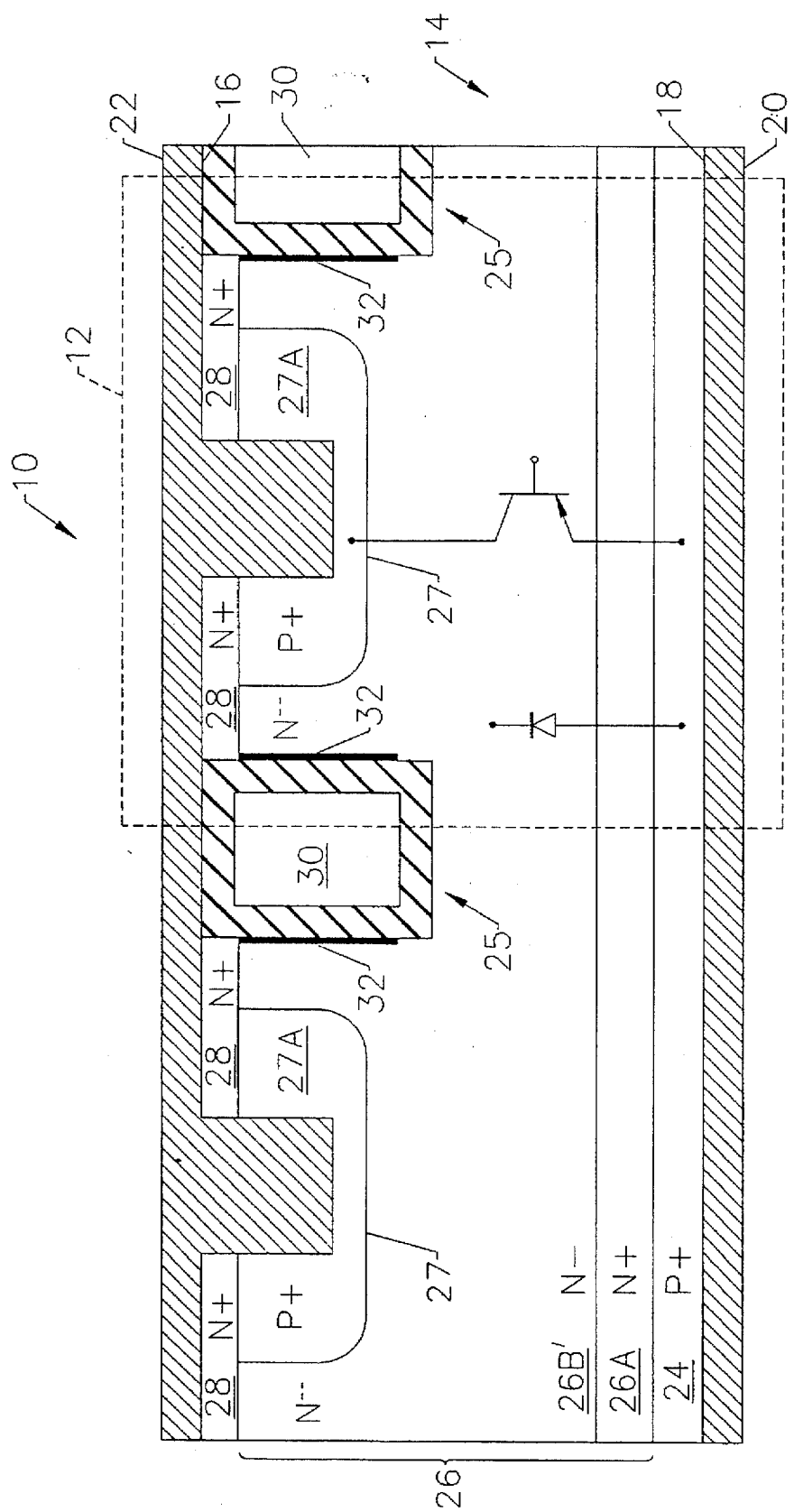
FIG. 7 is a cross-section illustration of a bipolar depleted base transistor according to a fourth embodiment of the present invention.
Figure 8:
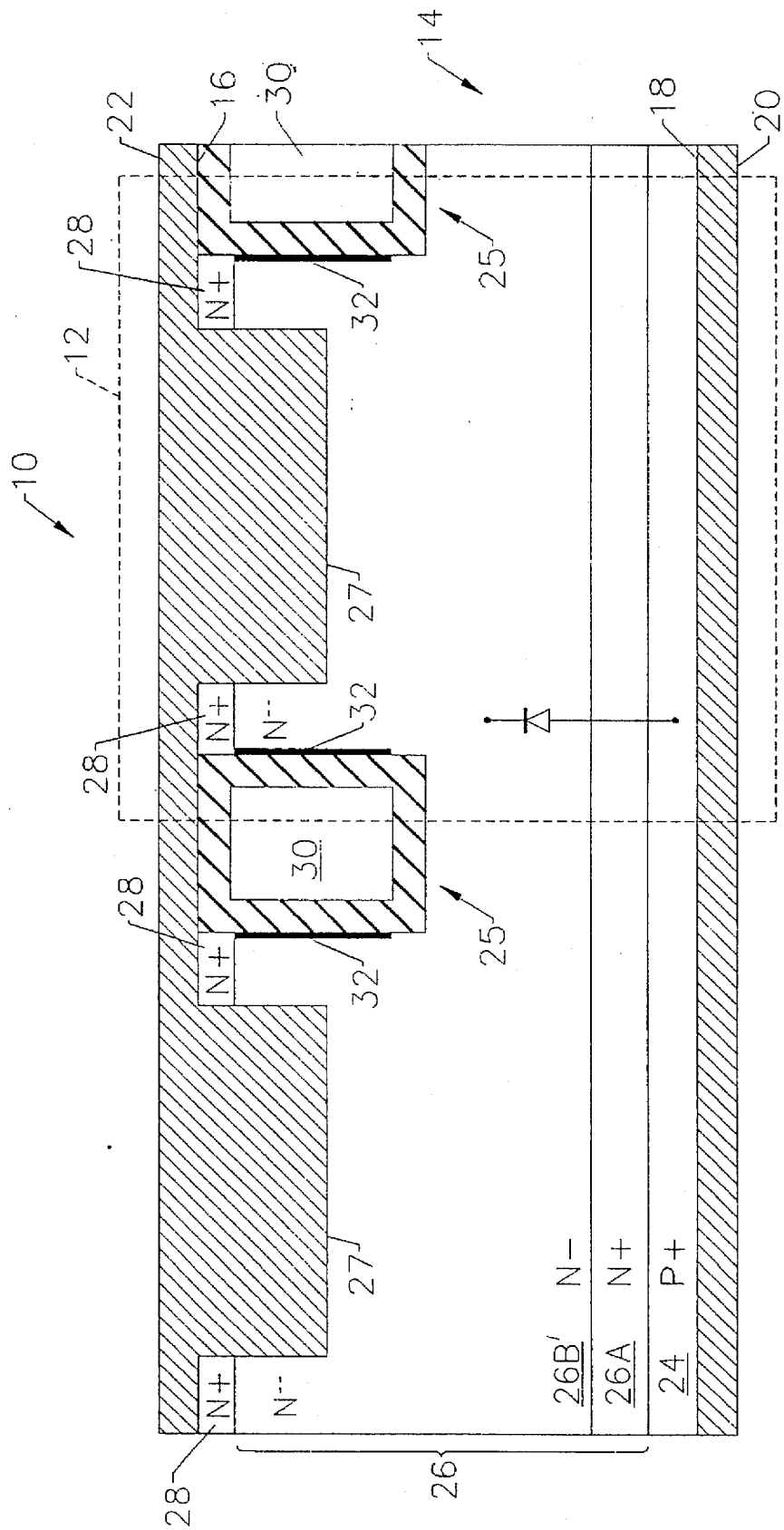
FIG. 8 is a cross-section illustration of a bipolar depleted base transistor according to a fifth embodiment of the present invention.
Figure 9:
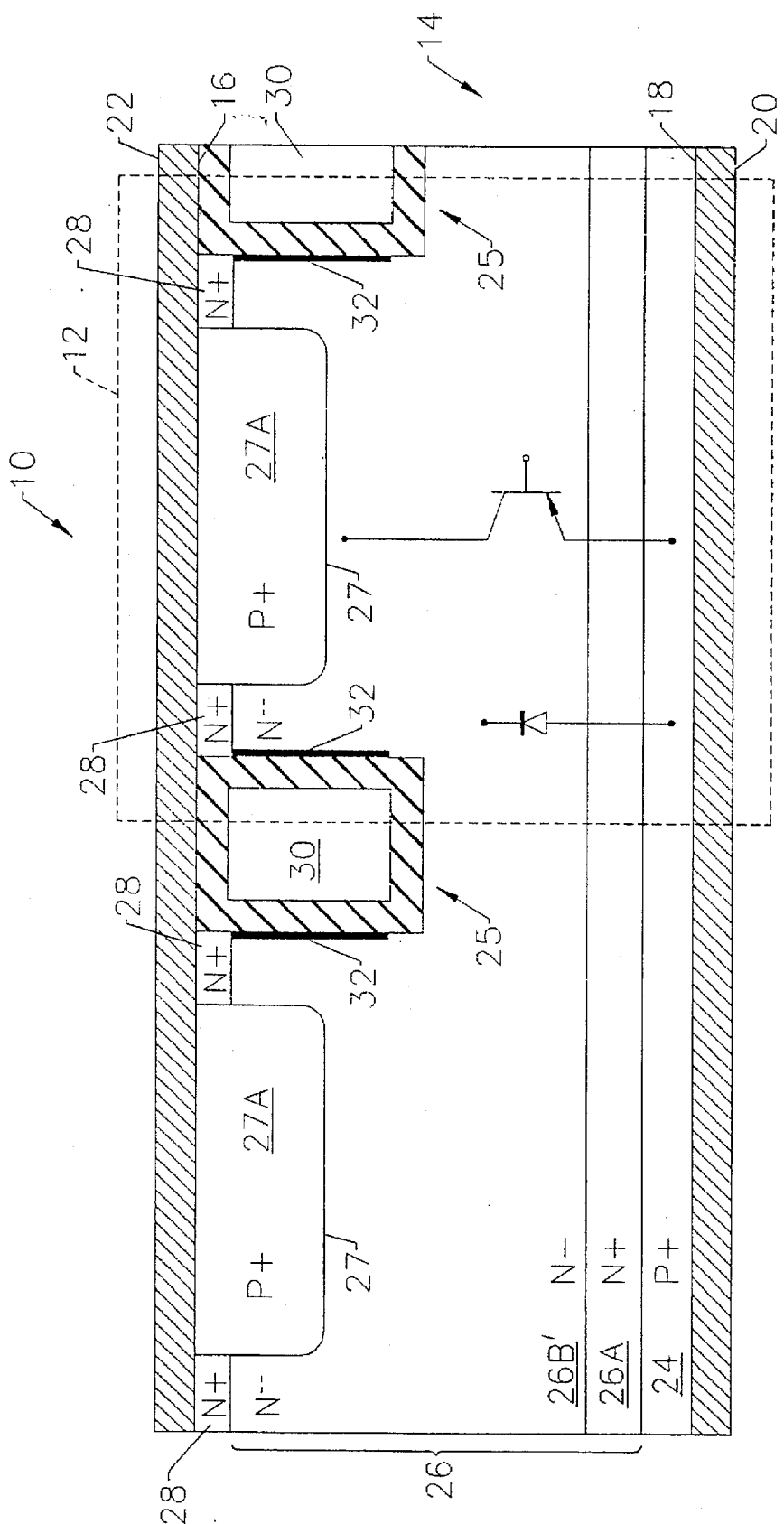
FIG. 9 is a cross-section illustration of a bipolar depleted base transistor according to a sixth embodiment of the present invention.

Referring now to FIGS. 7–9, the blocking voltage enhancement region 26C of FIGS. 4–6 can be eliminated and a larger drift region 26B', having a sloped doping gradient or profile, can be substituted therefor to approximate the improved performance achieved by the blocking voltage enhancement region 26C. In particular, the drift region 26B' can be doped to provide a doping profile having a continuous negative slope in a direction from the anode region 24 to the cathode region 28. Thus, even without a separate and distinct lower doped blocking voltage enhancement region 26C, the drift region 26B' can be doped so that its upper portion, which extends opposite the trench sidewall, has a lower doping concentration and can be fully depleted by the P-N or Schottky rectifying junction 27 which is spaced from the trench sidewall. In these embodiments, the monotonically decreasing doping profile is preferably selected so that the doping concentration in the drift region 26B' at the trench bottom is less than about one half times the maximum doping concentration of the drift region adjacent the buffer region 26A.

Figure 10:
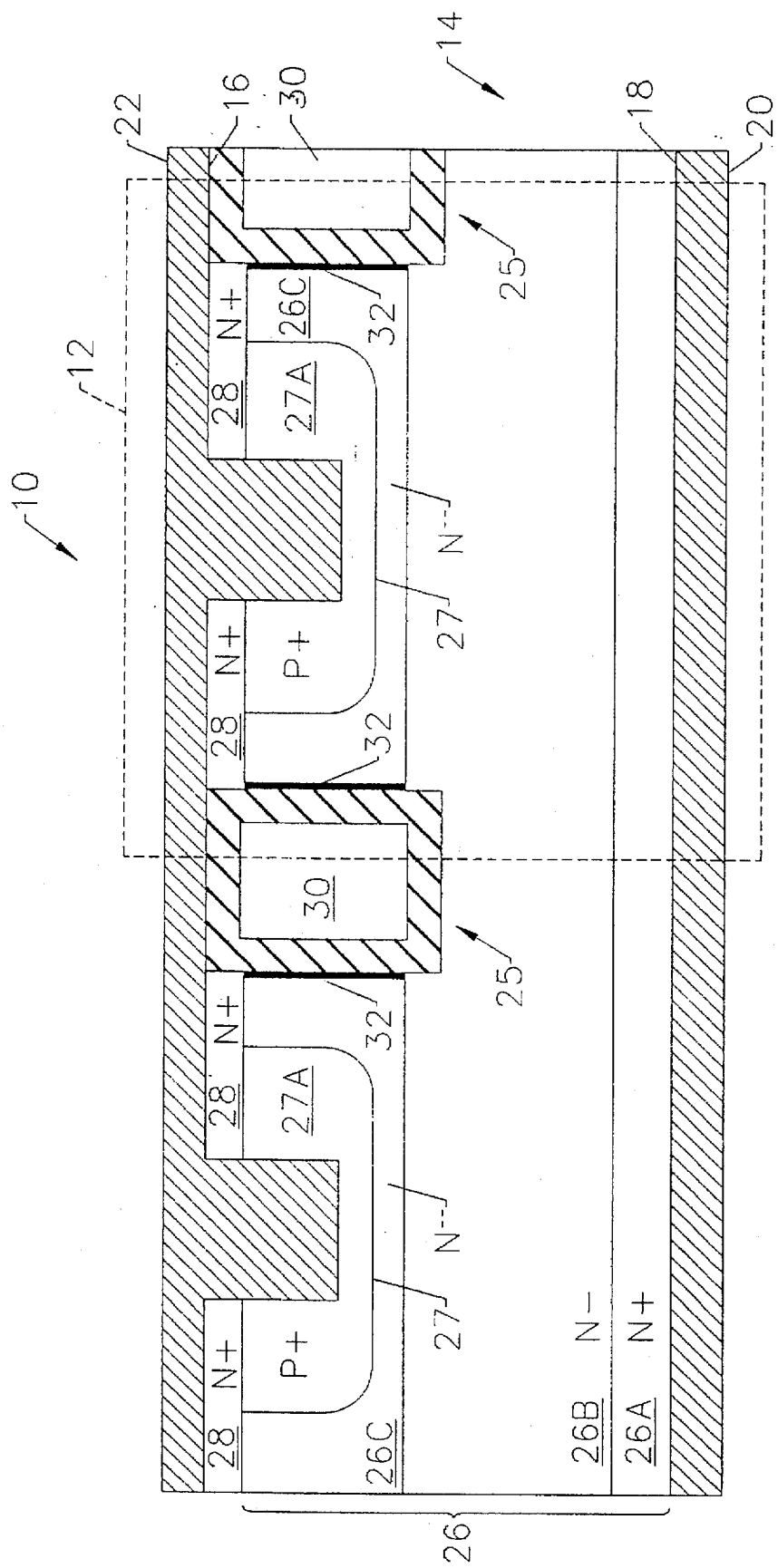
FIG. 10 is a cross-section illustration of a depleted base transistor according to a seventh embodiment of the present invention.
Figure 11:
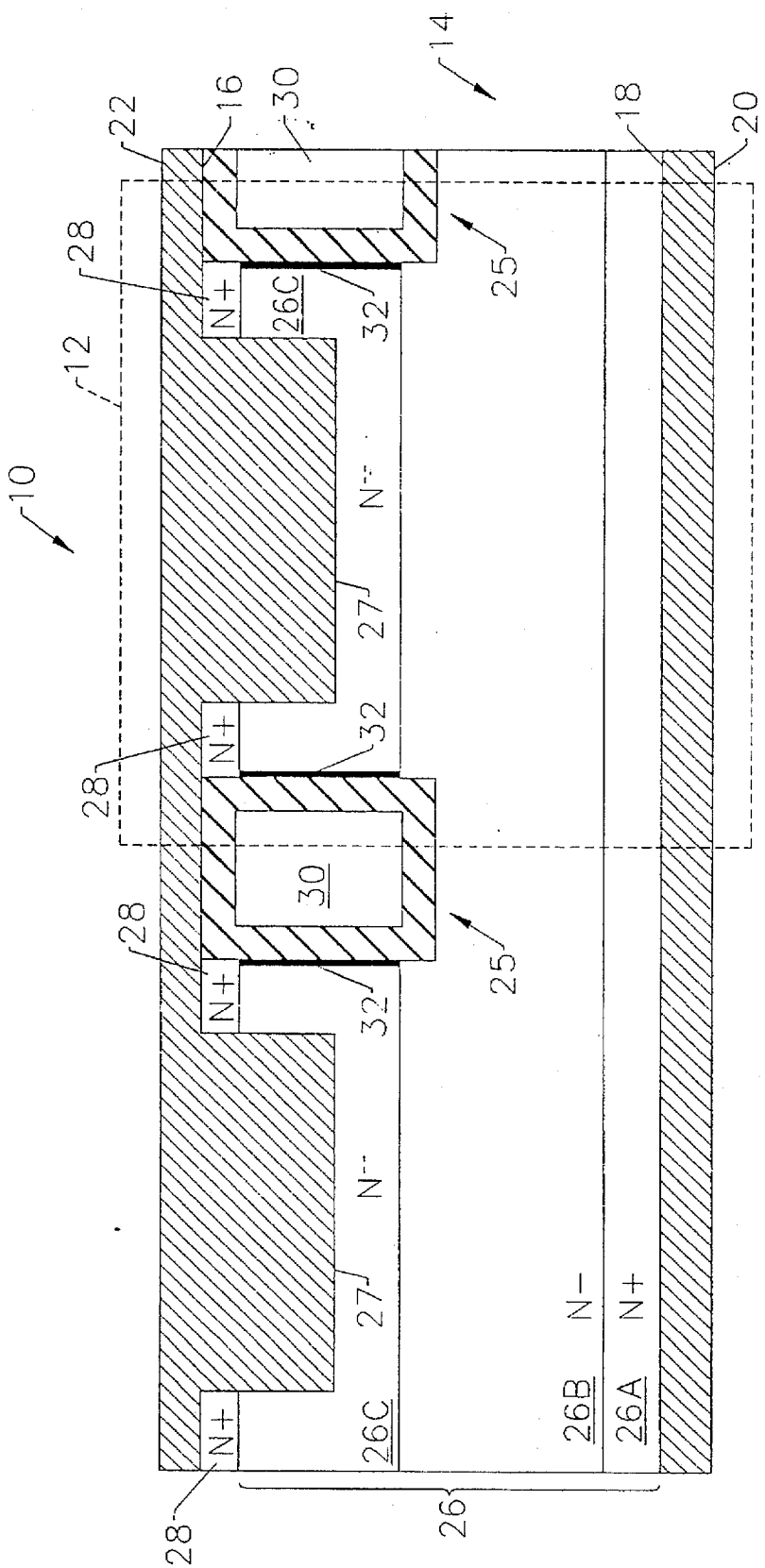
FIG. 11 is a cross-section illustration of a depleted base transistor according to a eighth embodiment of the present invention.
Figure 12:
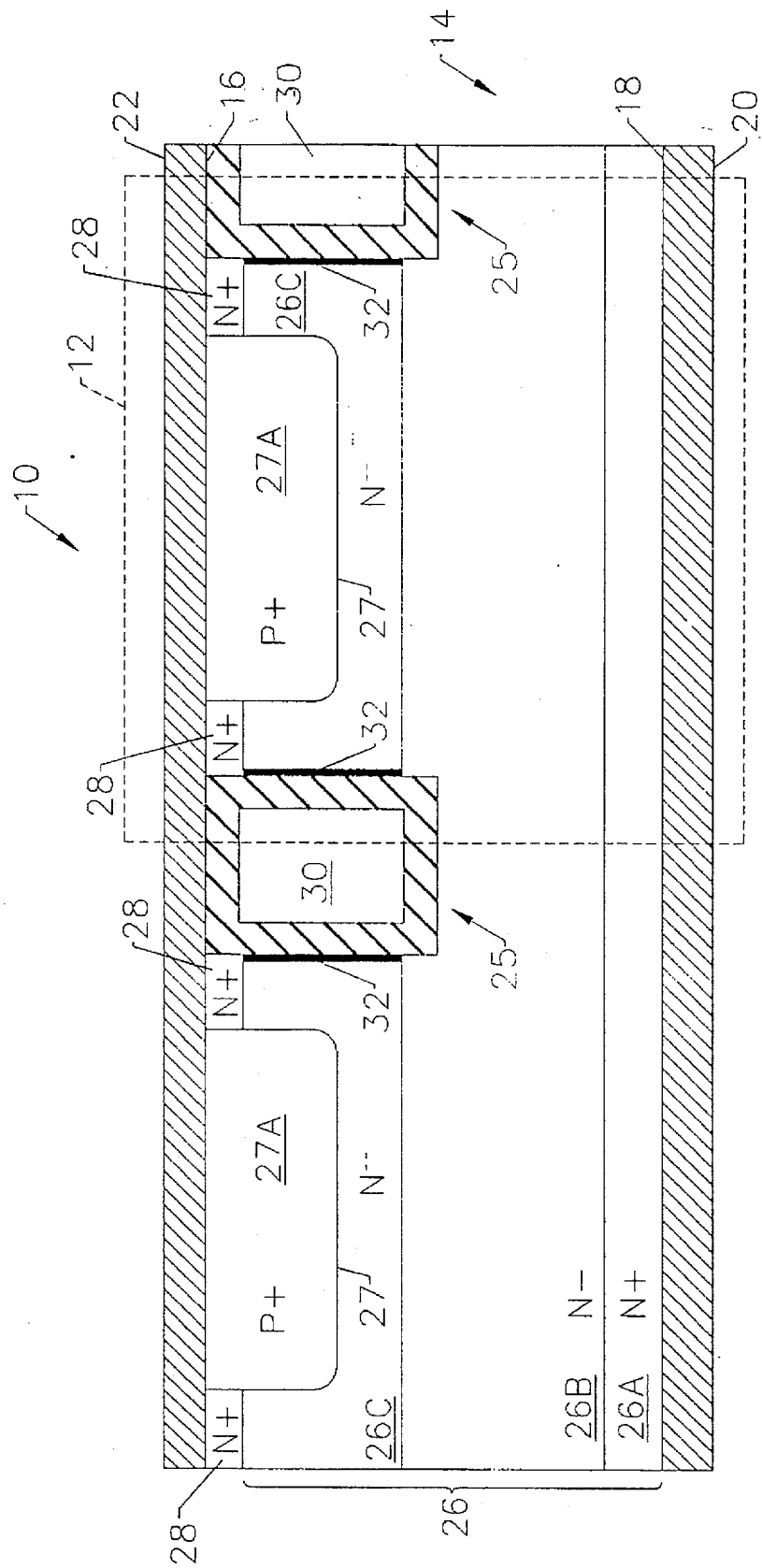
FIG. 12 is a cross-section illustration of a depleted base transistor according to a ninth embodiment of the present invention.

Referring now to FIGS. 10–12, the depleted base transistor of the present invention can also include a device having no forward biased P-N junctions in the forward conduction path, by eliminating the anode region of second conductivity type so that the anode contact ohmically contacts the buffer region 26A. This device is preferably formed of monocrystalline silicon carbide. In order to obtain forward current conduction between the buffer region 26A and the cathode region 28, a positive bias is applied to the insulated gate electrode 30 (e.g., P-type polysilicon) to create an accumulation layer channel 32. This provides a path for electrons to flow from the cathode region 28 into the drift region 26B. The forward current flows by majority carrier transport with the on-state resistance limited by the characteristics of the drift region 26B. For silicon carbide, the resistance of the drift region 26C can also be made low by doping it to a level of $1.8 \times 1.0^{16}$ cm$^{-3}$, however even at this level the device can be made to support high forward blocking voltages. As will be understood by those skilled in the art, the silicon carbide devices of FIGS. 10–12 can also switch at high speeds since the turn-on and turn-off times will only be limited by the drive impedance and capacitance of the insulated gate electrode 30.

The depleted base transistor of the present invention exhibits high voltage current saturation capability because the forward biased anode potential opposes low gate biases and causes pinch-off of the accumulation layer channel 32 formed across the blocking voltage enhancement region 26C. The occurrence of parasitic thyristor latch-up can also be almost entirely suppressed or eliminated so the depleted base transistor of the present invention has high maximum controllable current density. The transistor also has excellent surge current handling capability because of its diode like on-state characteristics.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A depleted base transistor comprising:
   a semiconductor substrate having first and second opposing faces;
   a cathode contact on the first face;
   an anode contact on the second face;
   a cathode region of first conductivity type in said substrate at the first face, said cathode region forming an ohmic contact with said cathode contact;
   a trench in said substrate at the first face, said trench having a trench bottom and a trench sidewall extending between the trench bottom and the first face;
   a base region of first conductivity type in said substrate, between said cathode region and said anode contact, said base region comprising:
      a drift region of first conductivity type having a drift region doping concentration;
      a blocking voltage enhancement region of first conductivity type extending between said drift region and said cathode region, said blocking voltage enhancement region forming non-rectifying junctions with said cathode region and said drift region and having a blocking voltage enhancement region doping concentration below the drift region doping concentration;
      an insulated gate electrode in said trench; and
   means, comprising a rectifying junction in said substrate, for depleting said blocking voltage enhancement region of majority free carriers to thereby inhibit traversal of majority carriers from said cathode region to said drift region.

2. The depleted base transistor of claim 1, further comprising an anode region of second conductivity type in said substrate at the second face, said anode region forming an ohmic contact with said anode contact and a P-N rectifying junction with said base region.

3. The depleted base transistor of claim 1, wherein the blocking voltage enhancement region doping concentration is less than about one half times the drift region doping concentration.

4. The depleted base transistor of claim 1, wherein said base region is of N-type conductivity and wherein said insulated gate electrode comprises polycrystalline silicon of P-type conductivity.

5. The depleted base transistor of claim 1, wherein said semiconductor substrate comprises monocrystalline silicon carbide.

6. The depleted base transistor of claim 2, wherein the trench sidewall defines an interface between said blocking voltage enhancement region and said insulated gate electrode.

7. The depleted base transistor of claim 6, wherein the trench bottom defines an interface between said drift region and said insulated gate electrode.

8. The depleted base transistor of claim 7, wherein a portion of the trench sidewall, adjacent the trench bottom, defines an interface between said drift region and said insulated gate electrode.

9. The depleted base transistor of claim 8, wherein the rectifying junction is selected from the group consisting of P-N and Schottky junctions.

10. The depleted base transistor of claim 7, wherein said base region further comprises a buffer region of first conductivity type between said drift region and said anode region and wherein said buffer region forms a non-rectifying junction with said drift region and a P-N junction with said anode region.

11. The depleted base transistor of claim 8, wherein said blocking voltage enhancement region extends between the trench sidewall and the rectifying junction.

12. The depleted base transistor of claim 11, wherein the rectifying junction comprises a collector region of second conductivity type on said blocking voltage enhancement region and wherein said collector region ohmically contacts said cathode contact.

13. A depleted base transistor comprising:
   a monocrystalline silicon carbide substrate;
   a cathode contact and an anode contact on said silicon carbide substrate;
   a silicon carbide cathode region of first conductivity type in said silicon carbide substrate, said silicon carbide cathode region forming an ohmic contact with said cathode contact;
   a silicon carbide anode region of second conductivity type in said silicon carbide substrate, said silicon carbide anode region forming an ohmic contact with said anode contact;
   a silicon carbide base region of first conductivity type in said substrate, between said silicon carbide cathode region and said silicon carbide anode region, said silicon carbide base region comprising:
      a silicon carbide drift region of first conductivity type having a drift region doping concentration;
      a silicon carbide blocking voltage enhancement region of first conductivity type extending between said silicon carbide drift region and said silicon carbide cathode region, said silicon carbide blocking voltage enhancement region forming non-rectifying junctions with said silicon carbide cathode region and said silicon carbide drift region and having a blocking voltage enhancement region doping concentration below the drift region doping concentration;
   a trench in said substrate at the first face, said trench having a trench bottom which defines an interface between said silicon carbide drift region and an interior of said trench and a trench sidewall which defines an interface between said silicon carbide blocking voltage enhancement region and the interior of said trench;
   an insulated gate electrode in the interior of said trench; and
   means, comprising a silicon carbide rectifying junction spaced from the trench sidewall and selected from the group consisting of P-N junctions and Schottky junctions, for depleting said silicon carbide blocking voltage enhancement region of majority free carriers to thereby inhibit traversal of majority carriers from said silicon carbide cathode region to said silicon carbide drift region.

14. The depleted base transistor of claim 13, wherein the silicon carbide blocking voltage enhancement region doping concentration is less than about one half times the silicon carbide drift region doping concentration.

15. The depleted base transistor of claim 13, wherein said silicon carbide base region is of N-type conductivity and wherein said insulated gate electrode comprises polycrystalline silicon of P-type conductivity.

16. The depleted base transistor of claim 13, wherein the silicon carbide rectifying junction comprises a silicon carbide collector region of second conductivity type in said silicon carbide substrate and wherein said silicon carbide collector region forms a P-N junction with said silicon carbide blocking voltage enhancement region and a P-N junction with said silicon carbide cathode region.

17. The depleted base transistor of claim 13, wherein the silicon carbide rectifying junction comprises a metal-filled trench having a bottom which defines an interface between a Schottky barrier metal and said silicon carbide blocking voltage enhancement region.

18. The depleted base transistor of claim 17, wherein the metal work function of the Schottky barrier metal is selected to fully deplete said silicon carbide blocking voltage enhancement region of majority free carriers when said insulated gate electrode, said cathode contact and said anode contact are biased to the same potential.

19. A trench-gated depleted base transistor, comprising:

a semiconductor substrate having a cathode contact and an anode contact thereon;

a cathode region of first conductivity type in said substrate and forming an ohmic contact with said cathode contact;

an anode region of second conductivity type in said substrate and forming an ohmic contact with said anode contact;

a base region of first conductivity type in said substrate, said base region forming non-rectifying and rectifying junctions with said cathode region and said anode region, respectively, and including a drift region having a nonuniform doping profile which is monotonically decreasing in a direction from said anode region to said cathode region;

a trench in said substrate, said trench having a trench sidewall which defines an interface between said nonuniformly doped drift region and an interior of said trench;

an insulated gate electrode in the interior of said trench; and means, comprising a rectifying junction spaced from the trench sidewall, for depleting said nonuniformly doped drift region of majority free carriers to thereby inhibit traversal of majority carriers from said cathode region to said anode region when said anode region is forward biased relative to said cathode region.

20. The depleted base transistor of claim 19, wherein said base region comprises a buffer region of first conductivity type which forms an abrupt P-N junction with said anode region.

21. The depleted base transistor of claim 19, wherein said base region comprises a buffer region of first conductivity type which forms abrupt junctions with said anode region and said nonuniformly doped drift region.

22. The depleted base transistor of claim 19, wherein said base region is of N-type conductivity and wherein said insulated gate electrode comprises polycrystalline silicon of P-type conductivity.

23. The depleted base transistor of claim 19, wherein the rectifying junction comprises a collector region of second conductivity type in said nonuniformly doped drift region and wherein said collector region ohmically contacts said cathode contact.

24. A depleted base transistor comprising:

a semiconductor substrate having first and second opposing faces;

a cathode contact on the first face;

an anode contact on the second face;

an anode region, buffer region, drift region, blocking voltage enhancement region, cathode region and collector region in said substrate, said anode region, buffer region, drift region, blocking voltage enhancement region and cathode region being arranged to respectively form a P+N+N-N-N+ diode from said anode contact to said cathode contact, said anode region, buffer region, drift region, blocking voltage enhancement region and collector region being arranged respectively to form a P+N+N-N-P+ bipolar junction transistor from said anode contact to said cathode contact and wherein an N-type conductivity of said blocking voltage enhancement region is less than about one half times an N-type conductivity type of said drift region;

a trench in said substrate at the first face, said trench having a trench bottom and a trench sidewall extending between the trench bottom and the first face and adjacent the blocking voltage enhancement region; and an insulated gate electrode in said trench and positioned relative to said blocking voltage enhancement region so that the application of a bias to said insulated gate electrode causes the formation of an accumulation layer of majority free carriers adjacent the trench sidewall, between said cathode region and said drift region.

25. The depleted base transistor of claim 24, wherein said anode region, buffer region, drift region, blocking voltage enhancement region, cathode region and collector region form abrupt semiconductor junctions with respective adjacent regions.

26. The depleted base transistor of claim 24, wherein said insulated gate electrode comprises polycrystalline silicon of P-type conductivity.

27. A depleted base transistor comprising:

a semiconductor substrate having first and second opposing faces;

a cathode contact on the first face;

an anode contact on the second face;

an N-type cathode region in said substrate at the first face, said cathode region forming an ohmic contact with said cathode contact;

a P-type anode region in said substrate at the second face, said anode region forming an ohmic contact with said anode contact;

a trench in said substrate at the first face, said trench having a trench bottom and a trench sidewall extending between the trench bottom and the first face;

an N-type base region of first conductivity type in said substrate, said N-type base region extending between said N-type cathode region and said P-type anode region and forming a non-rectifying junction with said N-type cathode region;

a P-type polycrystalline silicon insulated gate electrode in said trench; and means, comprising a rectifying junction in said substrate and adjacent the first face, for depleting a portion of said N-type base region of N-type carriers to thereby inhibit traversal of majority carriers from said N-type cathode region to said P-type anode region when said P-type anode region is forward biased relative to said N-type cathode region.

28. The depleted base transistor of claim 27, wherein the rectifying junction is selected from the group consisting of P-N and Schottky junctions.

29. A depleted base transistor comprising:

a monocrystalline silicon carbide substrate having first and second opposing faces;

a cathode contact and an anode contact on the first and second opposing faces of said silicon carbide substrate, respectively;

an N-type silicon carbide cathode region in said silicon carbide substrate, said silicon carbide cathode region forming an ohmic contact with said cathode contact;

an N-type silicon carbide base region in said substrate, between said silicon carbide cathode region and the second face, said silicon carbide base region comprising:

a silicon carbide buffer region adjacent the second face, said silicon carbide buffer region forming an ohmic contact with said anode contact;

a silicon carbide drift region of first conductivity type having a drift region doping concentration and forming a non-rectifying junction with said silicon carbide buffer region;

a silicon carbide blocking voltage enhancement region of first conductivity type extending between said silicon carbide drift region and said silicon carbide cathode region, said silicon carbide blocking voltage enhancement region forming non-rectifying junctions with said silicon carbide cathode region and said silicon carbide drift region and having a blocking voltage enhancement region doping concentration below the drift region doping concentration;

a trench in said substrate at the first face, said trench having a trench bottom which defines an interface between said silicon carbide drift region and an interior of said trench and a trench sidewall which defines an interface between said silicon carbide blocking voltage enhancement region and the interior of said trench;

an insulated gate electrode in the interior of said trench; and means, comprising a silicon carbide rectifying junction spaced from the trench sidewall and selected from the group consisting of P-N junctions and Schottky junctions, for depleting said silicon carbide blocking voltage enhancement region of majority free carriers to thereby inhibit traversal of majority carriers from said silicon carbide cathode region to said silicon carbide drift region.

30. The depleted base transistor of claim 29, wherein the silicon carbide blocking voltage enhancement region doping concentration is less than about one half times the silicon carbide drift region doping concentration.

31. The depleted base transistor of claim 29, wherein said insulated gate electrode comprises polycrystalline silicon of P-type conductivity.

32. The depleted base transistor of claim 29, wherein the silicon carbide rectifying junction comprises a P-type silicon carbide collector region in said silicon carbide substrate and wherein said silicon carbide collector region forms a P-N junction with said silicon carbide blocking voltage enhancement region and a P-N junction with said silicon carbide cathode region.

33. The depleted base transistor of claim 29, wherein the silicon carbide rectifying junction comprises a metal-filled trench having a bottom which defines an interface between a Schottky barrier metal and said silicon carbide blocking voltage enhancement region.

34. The depleted base transistor of claim 33, wherein the metal work function of the Schottky barrier metal is selected to fully deplete said silicon carbide blocking voltage enhancement region of majority free carriers when said insulated gate electrode, said cathode contact and said anode contact are biased to the same potential.

* * * * *